United States Patent
Bateman

(10) Patent No.: US 7,096,144 B1
(45) Date of Patent: Aug. 22, 2006

(54) DIGITAL SIGNAL SAMPLER

(75) Inventor: Bruce L. Bateman, Fremont, CA (US)

(73) Assignee: T-RAM, Inc., Milpitas, CA (US)

( * ) Notice: Subject to any disclaimer, the term of this patent is extended or adjusted under 35 U.S.C. 154(b) by 23 days.

(21) Appl. No.: 10/913,907

(22) Filed: Aug. 9, 2004

(51) Int. Cl.
*G01M 19/00* (2006.01)
*G06F 19/00* (2006.01)

(52) U.S. Cl. .................... 702/125; 702/79; 702/89; 702/176

(58) Field of Classification Search ................ None
See application file for complete search history.

(56) References Cited

U.S. PATENT DOCUMENTS

2004/0173003 A1* 9/2004 Ibane ................... 73/1.42

OTHER PUBLICATIONS

Ron Ho, et al., "Applications of On-Chip Samplers for Test and Measurement of Integrated Circuits," 1998 Symposium on VLSI Circuits Digest of Technical Papers, pp. 138-139.

T. Mori, et al. "A 1V 0.9mW at 100MHz 2kx16b SRAM utilizing a Half-Swing Pulsed-Decoder and Write-Bus Architecture in 0.25um Dual-Vt CMOS," ISSCC, 1998, pp. 22.4-1 to 22.4-10.

P. Larsson and C. Svensson, "Measuring high-bandwidth signals in CMOS circuits," Electronics Letters, vol. 29, No. 20, 1993, pp. 1761-2.

* cited by examiner

*Primary Examiner*—John Barlow
*Assistant Examiner*—Sujoy Kundu

(57) ABSTRACT

A sampling circuit for testing an integrated circuit receives several signals from points of interest in the integrated circuit, digitizes them, and determines whether the digitized signal is above or below a threshold. By sampling the signal at different phases of a system clock signal, a determination can be made of when during the system clock signal the signal at a point of interest changed state. Circuits are provided for making minimal impact on the circuit being observed. Circuits are also provided for clocking the observed signal so that it can be compared to other observed signals.

13 Claims, 6 Drawing Sheets

DIGITAL SIGNAL SAMPLER

BACKGROUND

When new integrated circuit chips are being developed and tested, it is desirable to access internal nodes within the chip for measuring voltages, observing waveforms, or observing delays at the nodes. In the past, when internal features were larger, it was possible to place a probe on any internal node and measure the voltage or waveform. But with significant shrinkage, internal probing of a line within the integrated circuit is no longer possible, so probe pads are needed. And with the increase of complexity, there are many places to probe and it is not practical to place probe pads everywhere you want to observe a signal. E-beam probing of internal nodes is also possible, but expensive and time-consuming, so most circuits, at least in test chips, are designed to include circuits to bring one of several signals to a probe pad for observation.

Sample and Hold

For testing periodic signals, sampling oscilloscopes can illustrate the waveform of a periodic signal by taking successive samples from different parts of successive cycles of the periodic signal to generate and display a composite graph to illustrate the waveform. The paper "Applications of On-Chip Samplers for Test and Measurement of Integrated Circuits" by Ron Ho, Bharadwaj Amrutur, Ken Mai, Bennett Wilburn, Toshihiko Mori, and Mark Horowitz, Stanford University, ©1998 IEEE, describes a system that includes a circuit inside the chip to iteratively look at a selected point in the chip over successive cycles, sampling later and later points of the cycle in successive cycles, and putting that sampled signal on an oscilloscope to see the waveform. This method shows noise coupling or other glitches, and is thus ideal for looking at the particular internal point in the chip. But it requires taking many sample points, and manually observing an oscilloscope, and thus it is a time consuming method. Also, as signals and clocks get faster and faster, the difference between the signal clock and sample clock must get smaller and smaller. To accurately represent the rise time of, say, 10 picoseconds in a 1 nanosecond signal cycle will require on the order of 1000 samples to give 1 picosecond resolution. So if the signal clock is 1 gigahertz, the sample clock may need to be 1.001 gigahertz to give the 1000 samples. And this is difficult to achieve, requiring expensive frequency control. Also, it requires human manipulation. This method can not be implemented automatically by a tester computer. It would be desirable to use a testing method that could be implemented automatically by a tester computer, and would not require elaborate circuitry within the chip to produce accurate results.

BRIEF SUMMARY OF THE INVENTION

If it is desirable to know when the signal switches, but not necessary to know the shape of the waveform, the process can be simplified. Such is the case when developing many new integrated circuit structures. According to one aspect of the invention, the analog waveform is digitized and periodically sampled, and a determination is made of whether the signal is above or below a threshold at the time of sampling. In one situation, it is desirable to compare the time delay at which one signal changes state to the time delay at which another signal changes state. Circuitry within the chip can be further simplified if only the relative delay between two signals is needed, but not the absolute delay. The testing process can be performed by an automated tester without human intervention. In one embodiment, four detectors have four different threshold voltage capture points, thus giving some information about the waveform shape without requiring manual intervention. In order to provide accurate relative delays, it is important that the detectors (input buffers) have matched delays so that any difference in delay is due to the circuits being tested and not to the input buffers that digitize the signals for testing.

In one aspect of the invention, relative delays of different signals are observed by selecting the various signals, sampling them over a number of cycles with the sampling being successively delayed to observe later parts of the cycle, and the sampling of the various signals being done by flip flops controlled by a common clock. All signals being sampled must have substantially the same delay to the data input of flip flops that do the sampling so that their relative delays can be reliably compared.

The flip flops are identically designed, placed close to each other in the integrated circuit chip, and therefore they can reliably be assumed to have the same delays because a common clock signal arrives at all flip flops at close enough to the same time. In one embodiment, the delays are within 10 to 50 picoseconds of the same time. It is possible to use more than one stage of flip flops to make a larger number of signals available for comparison, but the relative delays of clock signals to all the flip flops in one stage must remain substantially the same, and increasing the number of places where signals are observed increases the difficulty of accurately designing the test circuit. Also, providing a larger number of places requires that more of the integrated circuit area be dedicated to the testing function.

In another aspect, the various signals are digitized using input buffers that are physically close to each other, made by the same process under the same conditions, and the circuit is laid out so the conductive lines from the signal source to the input buffers have common delay, preferably due to equal length and equal capacitance.

In yet another aspect, the input buffers that observe the signals are designed to present minimum capacitance to the circuit being observed. Thus delay differences between the signals as presented at an output pad are due to characteristics of the operating circuit and not due to characteristics of the testing circuit.

As another advantage of the invention compared to the prior art circuitry of Ho et al, ibid, the required resolution of the sample clock is less severe. Whereas the Ho et al. circuitry may have required 10 or more samples taken during the rise time of a switching signal, the present invention may require only one or even no samples taken while the signal is switching. Sampling simply needs to be frequent enough to provide the necessary accuracy to identify when the signal switches. Thus, the circuitry added to the integrated circuit for the purpose of testing is small and has minimum impact on the normal operation of the integrated circuit.

DETAILED DESCRIPTION OF THE DRAWINGS

Figure 1:
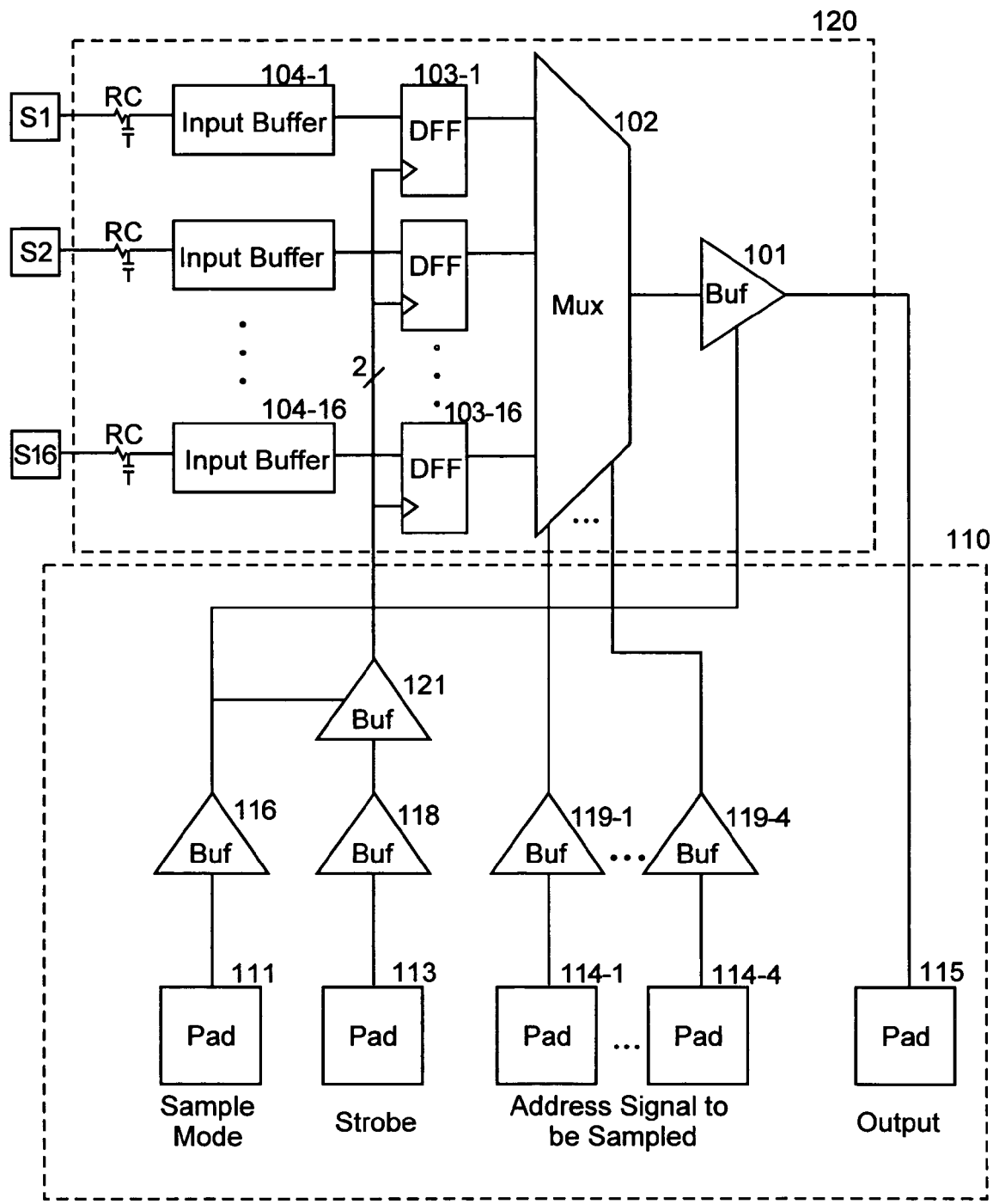
FIG. 1 shows a block diagram of a sampler structure according to the invention.

FIG. 1 shows a block diagram of a sampler structure according to the invention. FIG. 1 shows a sampler I/O and control circuit 110—and a sampler group 120. In sampler group 120, several input buffers 104, shown as 16 input buffers 104-1 through 104-16, receive input signals from nodes S1 through S16 within the integrated circuit chip to be tested. These input signals are likely to be analog signals with voltages varying between rails and switching in response to a system clock signal (not shown). Input buffers 104 digitize these analog input signals. Important for successful operation, the RC delays from the various signal nodes S1 through S16 to corresponding input buffers 104-1 through 104-16 must be substantially equalized so that detected delays actually reflect delay differences experienced by the signals and not delay differences inserted by the testing circuitry.

These input buffers 104 provide output signals that are received as data by flip flops 103, shown as DFFs 103-1 through 103-16. A strobe signal applied to pad 113 is buffered at buffer 118 and if the signal on pad 111 is an enabling sample mode signal for enabling the testing of signals S1 through S16, buffer 121 provides the strobe signal to clock inputs of flip flops 103. This single strobe signal assures that all inputs to multiplexer 102 will be picked up at the same phase of the system clock signal used to generate signals at nodes S1 through S16. One of the signals applied by flip flops 103 to multiplexer 102 is selected in response to address signals on pads 114 and applied to buffer 101. The signal at buffer 101 will be applied to pad 115 if buffer 101 is enabled by the SAMPLE MODE signal on pad 111.

Because delays to input buffers 104 are equal, delays observed at pad 115 can reliably be used to compare the relative delays of signals from nodes S1 through S16 received in sampler group 120.

Note that when testing is not being performed, some of the pads and pins used for testing can perform other functions. Indeed, in FIG. 1, only the sample mode pad 111 must be reserved for this single purpose. Pads 113, 114, and 115 can all be used for other purposes (through connections not shown) during normal operation of the integrated circuit chip.

Figure 2:
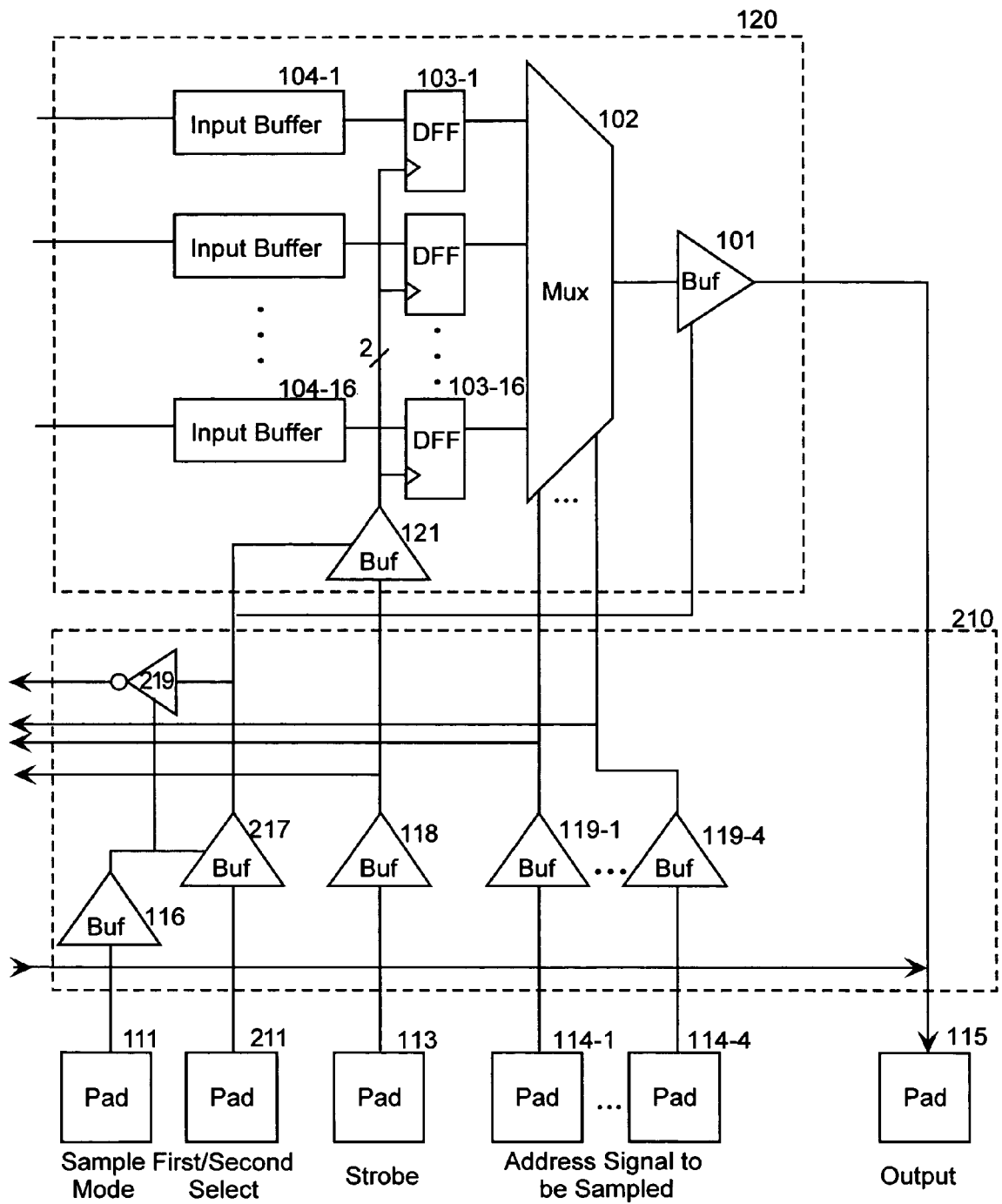
FIG. 2 shows a sampler structure according to the invention in which signals from more than one part of an integrated circuit chip can be sampled.

FIG. 2 includes circuitry for sampling signals in more than one part of the integrated circuit chip. It is important that when delays of signals in the circuit are being compared to each other, the circuitry for testing delay add the same amount of delay to all signals being compared. If signals to be compared are located at different parts of an integrated circuit chip, their relative delay can be most easily compared to nearby signals and not to signals from a different region of the integrated circuit chip. Yet it is preferable to minimize the number of external pins to be used for the testing and comparing. The structure of FIG. 2 includes one I/O control circuit 210 for moving signals on and off the chip, and a plurality of sampler groups 120 for sampling and comparing signals. Only one sampler group 120 is shown in FIG. 2 but it can be understood that other identical or similar sampler groups can be provided. The single I/O control circuit 210 differs from an equivalent control circuit 110 of FIG. 1 in that I/O control circuit 210 includes one more First/Second select pad 211 and related buffer 217, plus an inverter 219 not present in FIG. 1. Sample mode pad 111 controls both the circuit of FIG. 2 and another circuit not shown. Buffer 116 enables both buffer 217 and inverter 219, so that when the sample mode is not enabled, buffer 217 and its equivalent buffer 217 in the circuit not shown are disabled. In sample mode, both buffer 217 and inverter 219 are enabled. However, a high signal on pad 211 enables buffer 217 shown, and disables the equivalent buffer to buffer 217. In sample mode, when a high signal is applied to pad 211, buffer 217 turns on tri-state buffer 121, thus enabling sampler group circuit 120, but inverter 219 outputs a low signals, thus disabling another buffer equivalent to 121, and thereby disabling the other sampler group equivalent to 120.

The signal through buffer 217 controls the tri-state function of buffer 121 as shown, and through inverter 219 controls another circuit equivalent to sampler group 120 in another part of the integrated circuit chip. For simplicity, this other circuit equivalent to sampler group 120 is not shown. The other circuit is similar to sampler group 120 in having matched delays between signal sources and input buffers. However, delays from signals in this other sampler group can not be compared to delays in sampler group 120 because the absolute delay and therefore the relative delay between the two portions of the chip have not been calibrated. The other sampler group may differ in having another number of input signals applied to the multiplexer. In one embodiment, sampler group 120 of the chip uses a 16:1 multiplexer 102 and another sampler group uses an 8:1 multiplexer. Other numbers can of course be used. Furthermore, by providing more than one select signal on more than one pad such as 211, it is possible for a set of pads to access a larger number of sampler groups within the integrated circuit chip. Note that the First/Second control signal on pad 211 also provides a tri-state control signal to buffer 101. Thus, only when buffer 217 is enabled by the Sample Mode signal on pad 111 and the First/Second Select signal on pad 211 is providing an enabling input signal to buffer 217 does buffer 101 provide an output signal to pad 115. Thus, pad 115 can be used for providing output signals from more than one sampler group such as 120, and for other purposes when the integrated circuit chip is not in Sample Mode.

Figure 3:
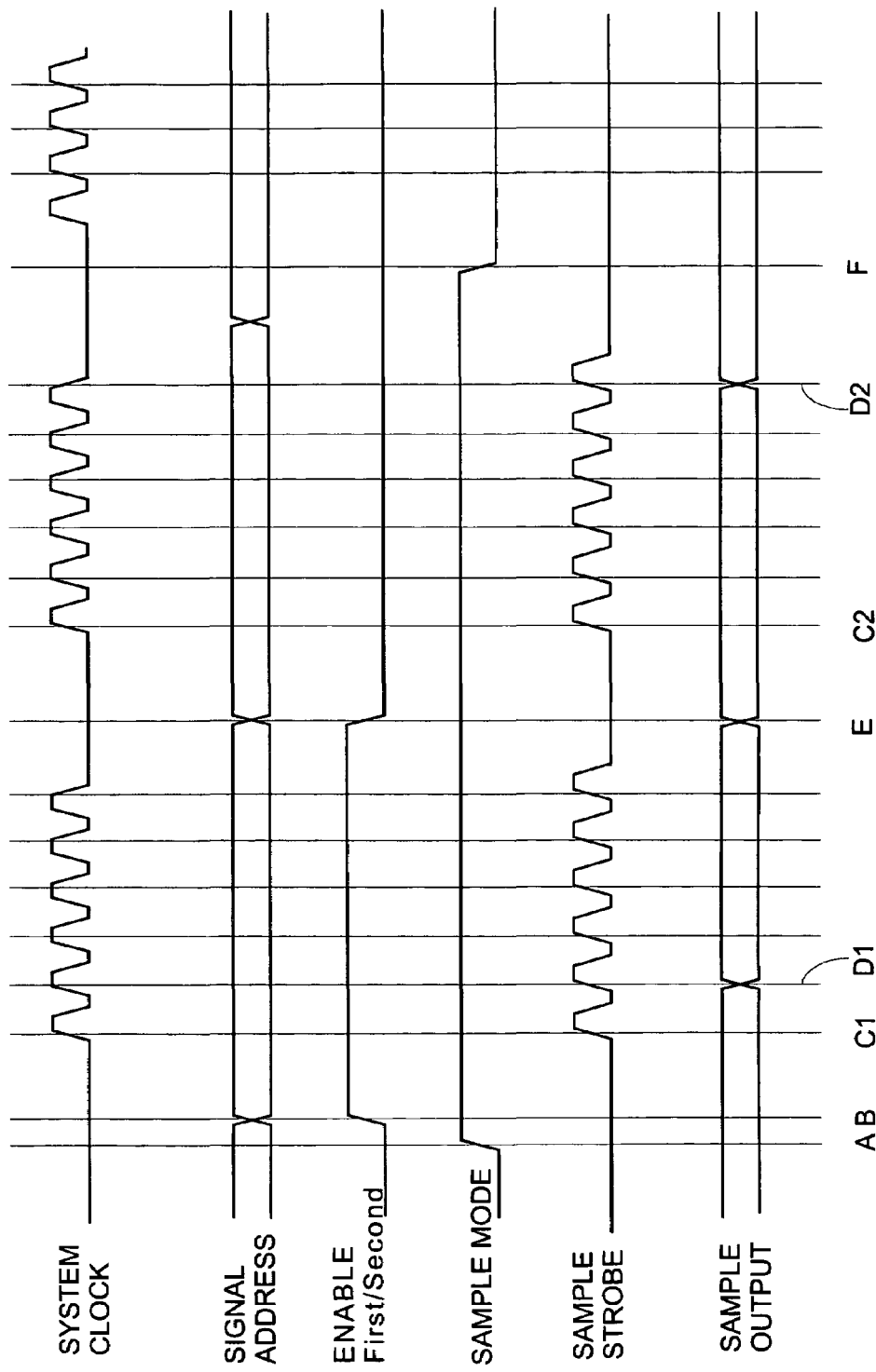
FIG. 3 shows a timing diagram of operation of the sampler circuitry.

Operation of the sampler circuitry is illustrated in the timing diagram of FIG. 3. FIG. 3 will now be discussed in combination with FIG. 1 and FIG. 2. At time A, a rising edge of the SAMPLE MODE signal (on pad 111 of FIG. 1 and FIG. 2) places the integrated circuit chip into SAMPLE MODE in which the selected portions of the circuit will be sampled and delays will be compared or other functions will be determined. At time B, external SIGNAL ADDRESS signals on pads 114 (FIGS. 1 and 2) and 211 (FIG. 2) cause the signal addressed by multiplexer 102 to be placed by buffer 101 onto pad 115 and to appear as the SAMPLE OUTPUT to be observed. In FIG. 1, the high SAMPLE MODE signal on pad 111, which is buffered by buffer 116, enables buffers 121 and 101. In FIG. 2, the high SAMPLE MODE signal on pad 111 in combination with a high First/Second Select signal on pad 211 enables buffers 121 and 101. Thus a rising SAMPLE STROBE signal on pad 113 will cause D flip flops 103 to capture the value on corresponding input buffers 104 to be applied to output pad 115.

At time C1, the system and strobe clocks are started for observing the first selected signal. In one embodiment, there is a small difference between the SYSTEM CLOCK frequency that generates signals S1 through S16 and the SAMPLE STROBE clock signal on pad 113. This small difference will allow output pad 115 to indicate where within the SYSTEM CLOCK cycle a signal S1 through S16 changed state. In a more general and powerful embodiment, the SAMPLE STROBE signal is provided by an automated tester that is synchronized with the SYSTEM CLOCK (which is also provided by the tester) but having a delay from the SYSTEM CLOCK that can be programmed by the tester on a cycle by cycle basis. In the first test cycle, the delay of SAMPLE STROBE from the SYSTEM CLOCK is set at some predetermined value. Then in each subsequent test cycle, the strobe delay of SAMPLE STROBE with respect to the SYSTEM CLOCK is incrementally increased or decreased, which has the effect of sweeping the strobe forward or backward in time relative to the SYSTEM CLOCK. On each cycle, the output pin 115 controlled by sampler circuit 210 or its equivalent is examined by the tester to determine what effect, if any, the change in the strobe delay had on the output of the sampler. If the rate at which the strobe delay is incremented or decremented in each cycle is constant, then this is mathematically equivalent to running the SYSTEM CLOCK and the SAMPLE STROBE at slightly different frequencies. The concept is to sweep the SAMPLE STROBE signal across the delay region of interest using the programmable delay functions of the tester. The SAMPLE STROBE clock signal is shown in FIG. 3 as slightly lower in frequency than the SYSTEM CLOCK, so that on successive cycles, the SAMPLE STROBE clock signal causes the flip flops to capture the signals addressed by the SIGNAL ADDRESS signals later and later in the phase of the SYSTEM CLOCK signal. At startup, the SYSTEM CLOCK and SAMPLE STROBE clock signals should be synchronized such that the SAMPLE STROBE CLOCK signal rises before a change is expected in the SAMPLE OUTPUT signal due to receiving the SYSTEM CLOCK signal.

Timing lines are drawn at the flip flop trip point of the SAMPLE STROBE signal (the time the flip flops capture their data). As with the prior art, the phase at which the signal S1 through S16 changes state can be accurately observed. However, unlike the prior art, observation can be performed by an automated tester, which receives digital SAMPLE OUTPUT signals and can determine at which SYSTEM CLOCK cycle the SAMPLE OUTPUT signals changed state. In the example of FIG. 3, at time D1, the observed signal changes state, illustrated to be on the second system clock cycle, in other words quite early in the clock cycle since the SAMPLE STROBE clock caused data to be captured early in the system clock cycle. After a sufficient number of system clock cycles have passed to observe the entire system clock cycle, the address is changed so that another signal may be sampled. Typically, several signals will be sampled within a single group so that they can be compared. However, for brevity, the illustration of FIG. 3 shows that the sampler group is changed, since at time E the ENABLE First/Second signal goes low at the same time the SIGNAL ADDRESS changes. In FIG. 3, at time C2, the system and SAMPLE STROBE clocks start, and this time a transition is observed at time D2, later in the observation period and therefore later in the clock cycle. This result would typically be compared to other signals within the same sampler group to determine relative delay in that portion of the integrated circuit chip.

Finally, when all signals have been observed, at time F, the SAMPLE MODE signal is brought low, and the integrated circuit is returned to normal operation.

If the system is well designed, delay caused by the observed signal passing through the D-flip flop, multiplexer, and buffer 101 are not important, because these delays are the same for all signals being sampled within a sampler group 120. Circuits that achieve this result are discussed below.

Figure 4:
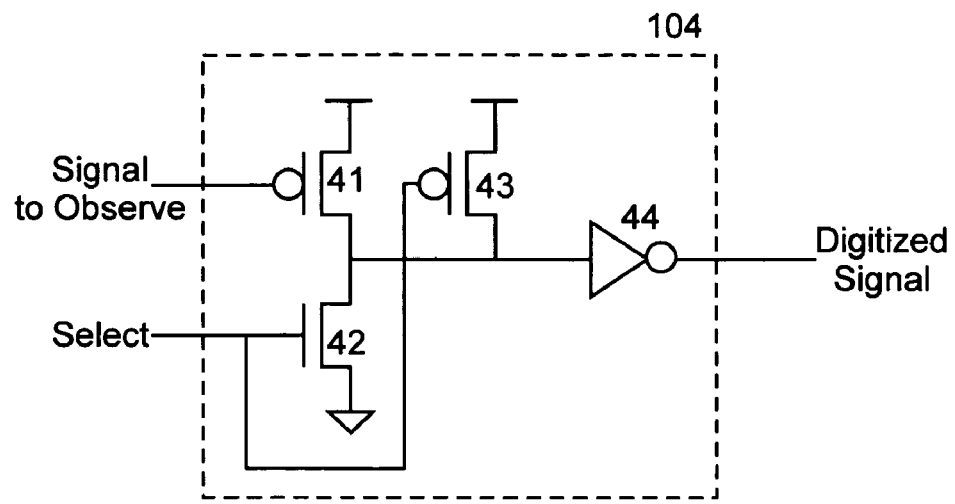
FIG. 4 shows an input buffer circuit useful for presenting minimum capacitance to an input signal.

Minimizing Effect of Measuring (FIG. 4)

In order to minimize the effect of adding a testing circuit to the circuits being measured, the capacitance presented by the measuring circuit to the circuit being observed is minimized. Also, in order to be able to compare nodes in a sampler group, all input buffers are designed to have the same, or nearly the same delay from the node being observed to the data input of the flip flop. FIG. 4 shows an input buffer circuit that presents low capacitance to the circuit being measured. A single transistor, p-channel transistor 41 receives on its gate the signal to be observed. Receiving the signal on a single transistor gate minimizes the capacitance seen by the node where the signal is being observed. In one embodiment, transistor 41 has a width of 2 microns and presents an input capacitance of only 1.9 femtofarads to the node being observed. The circuit of FIG. 4 also includes a Select control circuit so that when input buffers 104 are not being used, they do not consume power. In FIG. 4, transistor 42 acts as a resistor when enabled by a high Select signal. When the Select signal is high, transistors 41 and 42 act as an inverter, providing a high output signal through transistor 41 in response to a low Signal to Observe, and providing a low output signal through transistor 42 (acting as a resistor) in response to a high Signal to Observe. When the Select signal is high, transistor 43 does not contribute to the circuit. Inverter 44 sharpens edges and thus further digitizes the Signal to Observe.

A low Select signal turns off transistor 42 and turns on transistor 43, which pulls high the input signal to inverter 44 regardless of the state of the Signal to Observe, producing a constant low digitized output signal and thus saving power. The circuit of FIG. 4 is not as fast as a CMOS inverter circuit, but this is not a problem because delays of all such circuits in one sampler group will be the same.

The trip point of the inverter formed by transistors 41 and 42 is carefully selected to occur at a point of interest, typically by setting the relative widths of the PMOS and NMOS transistors that form the inverter. The trip point may be mid-way between the voltage rails or it may be closer to one rail or the other. The inverter formed by transistors 41 and 42 has a relatively high trip point because transistor 42 is made weak so that the input current to transistor 41 can easily overcome the resistance of transistor 42. If it is desired to have a lower trip point, a standard CMOS inverter can be used in place of the circuit of FIG. 4. But sizes must be chosen to assure substantially the same delays as other input buffers in the same sampler group, and capacitance presented to the node being tested will be larger.

Figure 5:
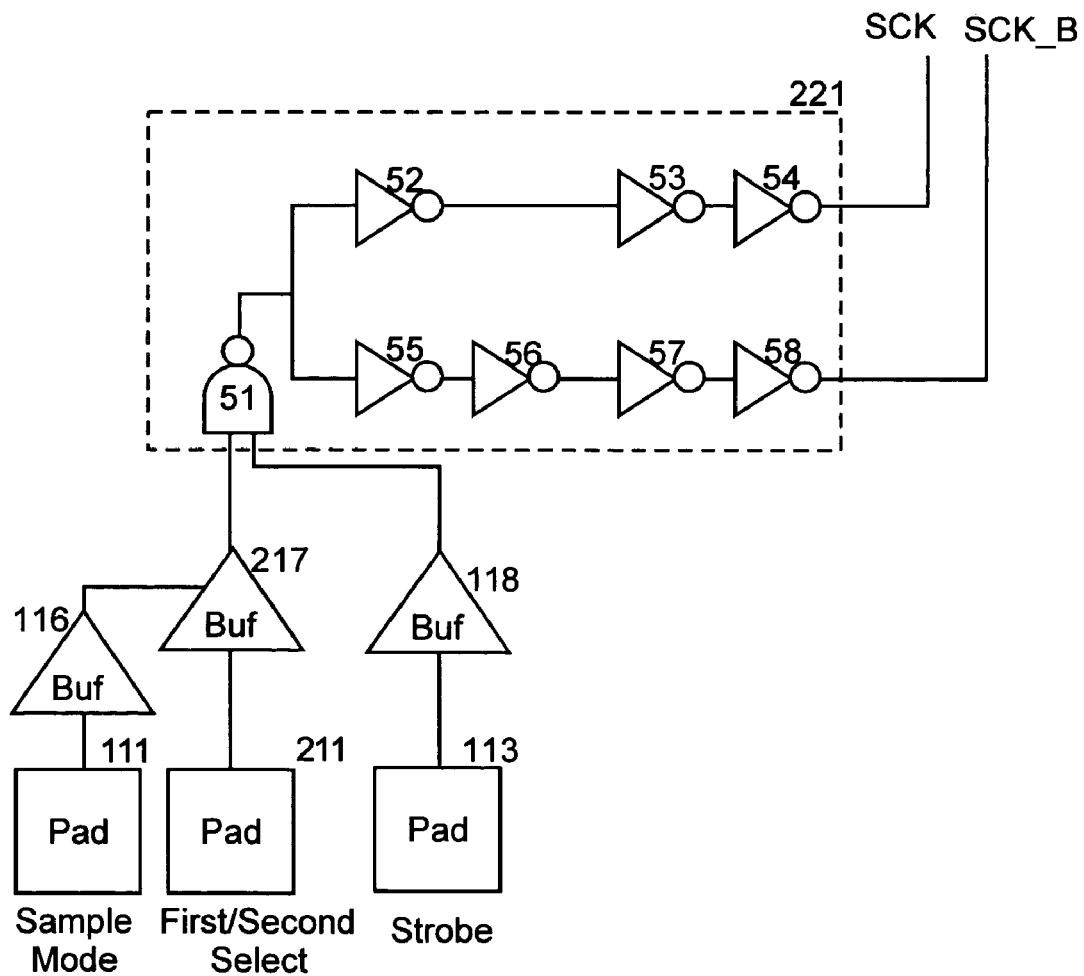
FIG. 5 shows a matched fork for generating inverted and non-inverted signals, useful for controlling a flip flop.

FIG. 5 Clocking Flip Flop for Small Setup and Hold

The flip flop is preferably a structure having very small set-up and hold times, but it isn't necessary to have a small delay through the flip flop, since the important feature is that the relative delay of signals is accurately determined. One flip flop structure useful in this instance is formed from two sequential tri-state inverters clocked by complementary signals. The important feature is how quickly the flip flop samples its input circuit, and not how long it takes the signal to be presented at the output terminal (the clock-to-out delay). The sampling window (set up time) is made as narrow as possible by providing sharp inverted and non-inverted clock signals to the master and slave portions of the flip flops and by matching the delays of these two signals so that they transition at the same time in order to minimize the sampling ambiguity. All inputs to all flips must be sampled at substantially the same time so that the sampling occurs reliably at a selected phase of the system clock signal.

FIG. 5 shows a matched fork circuit that can be used as buffer 121 of FIG. 2 for generating inverted and non-inverted clock signals from a single external Strobe signal. Seven inverters are used, all CMOS inverters with transistors having equal lengths. NAND gate 51 receives a First/Second Select signal from buffer 217, and a Strobe signal from buffer 118. If the Sample Mode signal is high, enabling buffer 217, and the Select signal is high, NAND gate 51 inverts the Strobe signal and provides the inverted signal to both tines of the fork. Inverters in the two tines of the fork are sized so that inverters 55 and 56 provide the same delay as inverter 52. This can be thought of as adjusting fanout of the inverters so that both tines of the fork have equal rising and falling edge delays. Inverters 53 and 54 of the upper tine and inverters 57 and 58 of the lower tine are matched, and serve to amplify and square the strobe signal.

Flip flops 103 can be implemented as master-slave flip flops, the important characteristic being that the master and slave portions of the flip flops are clocked simultaneously and quickly, thus minimizing the setup time and minimizing the time in which the input state is ambiguous. This clocking is achieved by the matched fork of FIG. 5.

Figure 6:
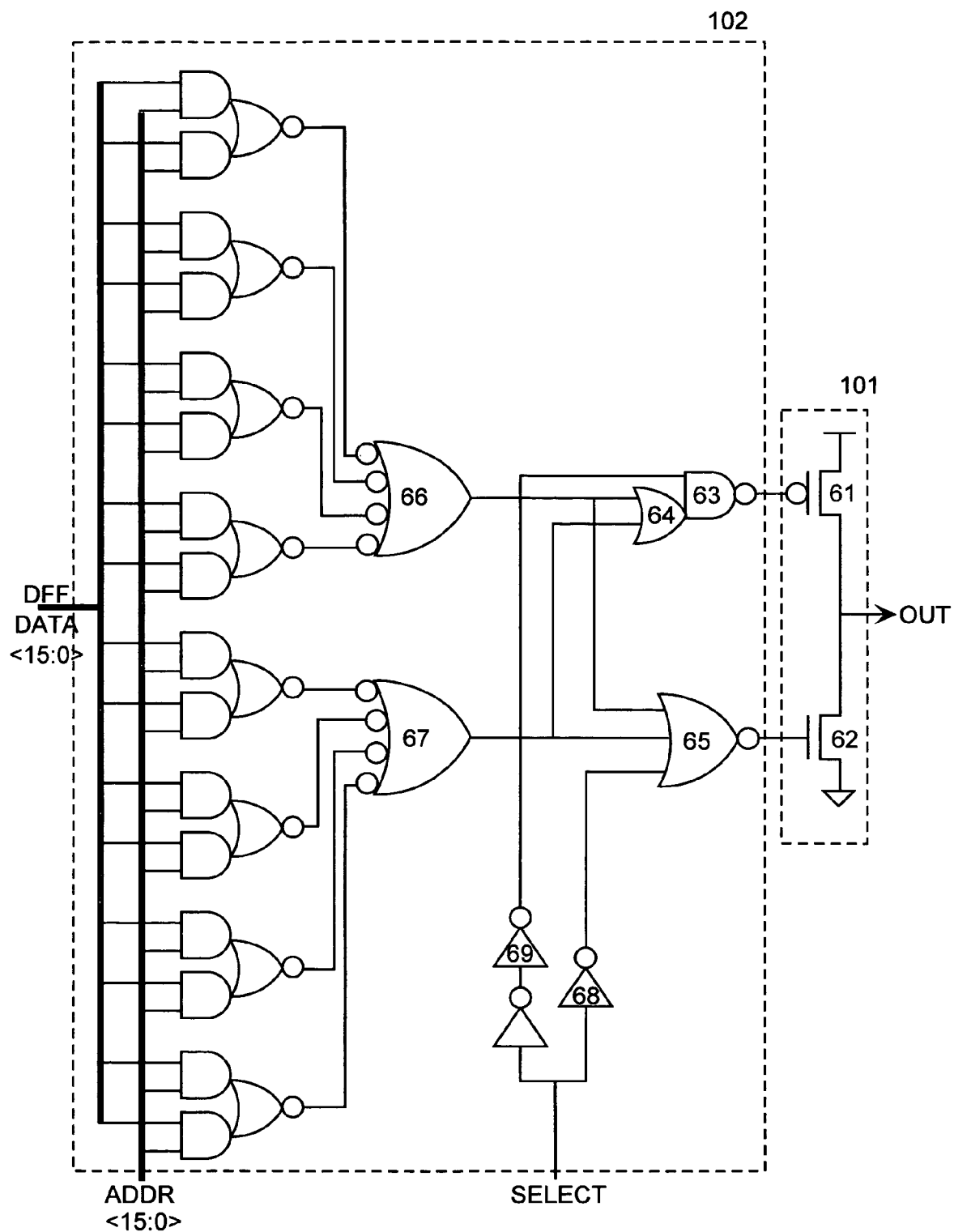
FIG. 6 shows a multiplexer and tri-state output buffer useful with the invention.

FIG. 6 shows a multiplexer and tri-state buffer structure that can implement multiplexer 102 and tri-state buffer 101 of FIGS. 1 and 2. To avoid any charge sharing problems, the multiplexer uses AND-OR logic and the tri-state control is combined with the last stage of the multiplexer structure. FIG. 6 shows a 16:1 multiplexer though other multiplexer sizes can of course be used. A decoder not shown but well known takes an address on four address lines and generates 16 one-hot output signals ADDR <15:0> in response to the address. Each of these 16 one-hot signals is ANDed with one of the data signals DFF DATA <15:0>, as shown. Since only one of the sixteen one-hot signals ADDR <15:0> is high, only one of the sixteen AND gates will forward its data signal. In the next stage, NAND gates 66 and 67 will either invert the selected signal or output a high signal. Outputs of NAND gates 66 and 67 are combined in gates 64 and 65. However, if the SELECT signal is low, meaning multiplexer 102 is not selected for sampling any of its input signals, NAND gate 63 will output a high signal regardless of the states of signals from NAND gates 66 and 67. Likewise, NOR gate 65 will output a low signal regardless of the states of NAND gates 66 and 67. Thus transistors 61 and 62 are both off when SELECT is low and the multiplexer circuit is in a tri-state mode.

However, if SELECT is high, meaning multiplexer 102 is selected for sampling one of its input signals, NAND gate 63 will respond to the state of OR gate 64, and provide a low output signal if either of 66 and 67 is high, thus turning on transistor 61 and pulling output signal OUT high. In this case NOR gate 65 will provide a low output signal, turning off transistor 62. And if both 66 and 67 are low, transistor 61 will be off and transistor 62 will be on, thus pulling output signal OUT low. Note that the SELECT signal is preferably provided through a balanced fork in which inverter 69 provides the non-inverted SELECT signal at the same time that inverter 68 provides the inverted SELECT signal.

The multiplexer of FIG. 6 adds some delay to the DFF DATA <15:0> signals but has the advantage of assuring that all data paths experience nearly equal delay so that relative delays can be accurately compared. Small delay differences occur at the different input ports of gates 66 and 67. Alternatively, multiplexer 102 can be implemented as a pass-gate multiplexer in which sixteen data signals DFF DATA <15:0> are applied to current carrying terminals of sixteen pass transistors, and the pass transistors are controlled by the sixteen one-hot signals ADDR <15:0>.

Figure 7:
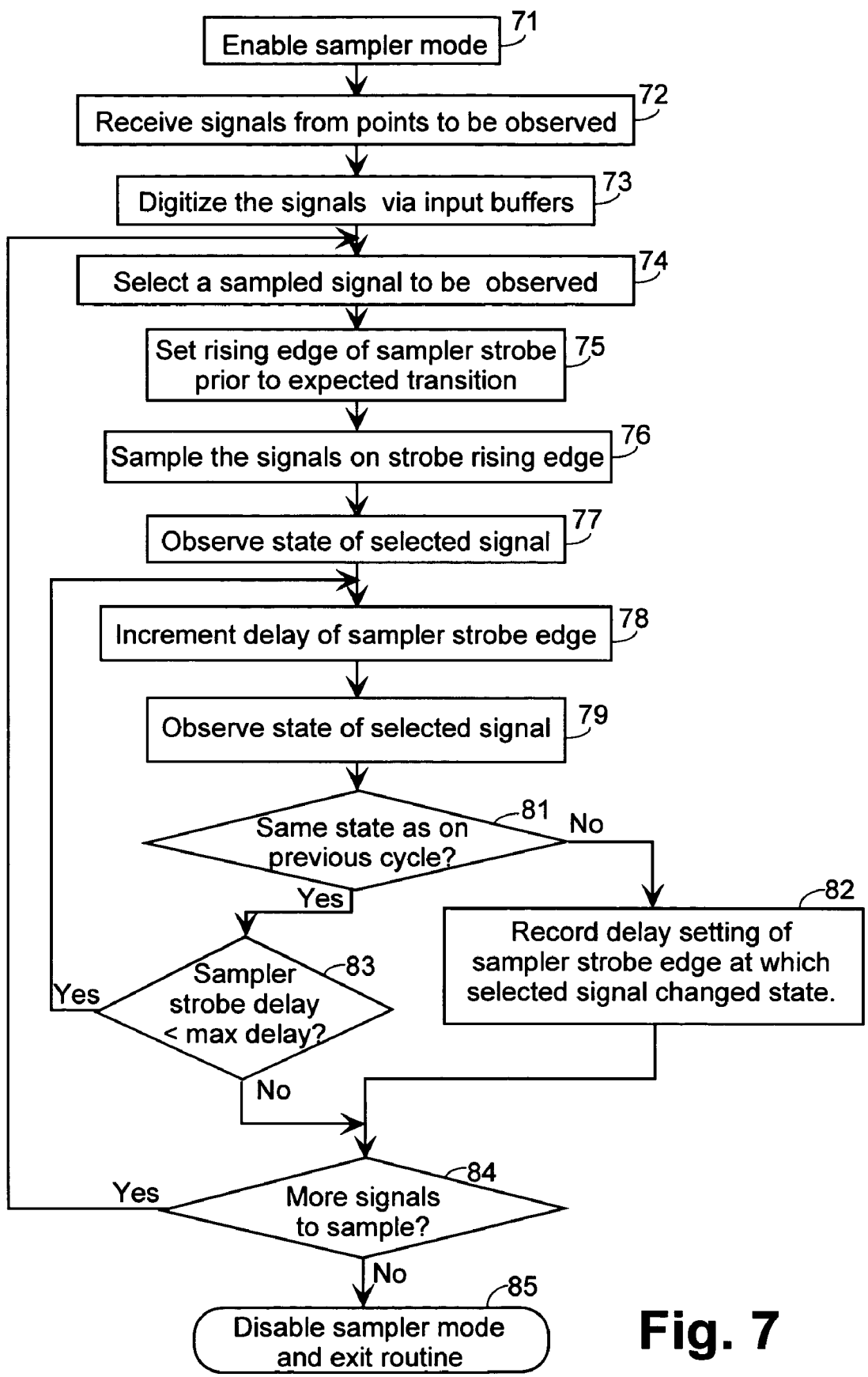
FIG. 7 shows a process for generating signal comparisons.

FIG. 7 shows a process for sampling and testing a plurality of signals with the sampling method of the invention. The method begins at step 71 with placing the integrated circuit into sampler mode so that selected signals can be tested.

Next, at step 72, signals that can be observed are received from the plurality of points or nodes having circuitry for observation.

At step 73, these original signals are digitized by input buffers that provide buffered (and possibly inverted) versions of the original signals.

At step 74, one of the digitized signals is selected, for example by a multiplexer, for observation.

Next, at step 75, a sampler strobe signal that controls when flip flops will sample the signals is synchronized with a system clock that causes the original signals to be generated. One synchronization method is to have the rising edges of the SYSTEM and SAMPLE STROBE clock signals coincide on their rising edges at the first cycle of the two clock signals. But other synchronizations can be used. The important factor is to assure that the sample clock edge rises before a transition is expected in the signal that has been selected for observation.

At step 76, when both clocks have been started, the selected signal is sampled on the strobe rising edge, and at step 77 the state of this signal is observed by the tester connected to the output pin (pin or pad 115 of FIG. 1 or FIG. 2). The state of this observation is stored in the tester, and at step 78, the sampling process moves to the next cycle of the SYSTEM and SAMPLER clocks. The next cycle of these clock signals increments a delay of the SAMPLER clock (strobe) edge, for example by having the SAMPLER clock run at a lower frequency that the SYSTEM clock.

At step 79, the signal is again observed (tested) and stored, and at step 81 the observed values are compared. If the observed state of the signal has changed, the process moves to step 82, and the delay setting of the SAMPLER clock that produced the change of state is recorded.

If the observed state of the signal has not changed, then the SAMPLER clock is further delayed until enough phases of relationship between the SYSTEM clock and SAMPLER clock have been tested. If no change occurs, the process continues at step 78 where at the next clock cycle the delay is again incremented. However, if the sampler strobe has completed all phases of the relationship, the process moves to step 84.

In step 84, a determination is made of whether there are more signals to be sampled. If so, the process moves to step 74 where another signal is selected to be observed (tested) and the process repeats. If step 84 indicates there are no more signals to sample, the testing process is complete, and at step 85 the sampler mode circuitry is disabled and the testing routine is exited.

In one application of the invention, the test circuit is used for testing a memory circuit having ribs of memory cells. Control of the memory cells occurs at the centers of each of the ribs. Delay of control signals to the memory cells close to the center is less than delay to memory cells at the periphery of the ribs. Placing test circuits at memory cells near the center and at memory cells near the periphery allows a designer to see whether timing relationships between related groups of signals at a periphery of the rib is different from timing relationship between related groups of signals at a central point. For example, it may be important to compare pulse widths or setup and hold relationships at different portions of the chip.

If the chip includes a reliable timing reference such as a balanced clock tree, it is also possible to compare timing on one portion of the chip to timing in another portion of the chip, and even to obtain an absolute delay value between various parts of the memory circuit by supplying the clock tree signal to one of the input buffers of the testing multiplexer 102 and comparing its delay to signals taken from other nodes in the memory circuit. However, if the clock tree is affected by jitter or skew, these can not be measured, and will simply reduce the accuracy of other timing measurements. Thus the performance of the memory circuit can be well understood. This is true even though the absolute delay through the testing circuits of FIGS. 1 and 2 is not known and not important.

The above description uses flip flops to perform the sample and hold function. In another embodiment, latches are used instead of flip flops in order to allow real-time (time-shifted) examination of internal signal transitions. Such an embodiment still gives accurate relative delays because the input buffers, latches, and multiplexer arms still have matched delays.

In one embodiment, some multiplexer arms receive several input signals from the same node but are buffered by input buffers having different threshold voltages, so that the output information can be used to develop a rough analog waveform of the signal if desired. The output information can also be used to detect glitches in signals at the node being observed. Yet all signals are digital, and all information can be collected by an automatic tester if desired. In another embodiment, all signals come from different nodes. In the above discussion, a method is described of sweeping the sample strobe once through phases of the system clock. In another embodiment, the sample strobe is swept both back and forward through phases of the system clock. In yet another embodiment, the sample strobe sweeps coarsely through phases of the system clock, and when a transition occurs, the signal is swept more finely near the transition, so that the transition can be accurately located.

In light of the above discussion, other embodiments of the invention will become obvious to those skilled in the art. These other embodiments may fall within the scope of the invention as defined by the appended claims.

The invention claimed is:

1. A method for testing a group of periodic signals generated by at least one circuit in a semiconductor device operating under a system clock signal, comprising:
   (a) providing a selection signal for selecting a first one of the group of periodic signals;
   (b) providing a strobe signal,
   (c) capturing a state of the first periodic signal in response to the strobe signal;
   (d) generating an output signal that is associated with the captured periodic signal;
   (e) shifting the strobe signal in time relative to the system clock signal;
   (f) repeating steps (c), (d) and (e) using the time shifted strobe signal until a termination criterion is met; and
   (g) providing another selection signal for selecting a second one of the group of periodic signals and repeating steps (b), (c), (d), (e) and (f) using the second periodic signal.

2. The method of claim 1 further comprising comparing the output signal associated with the first periodic signal with the output signal associated with the second periodic signal.

3. The method of claim 1 wherein at least the first periodic signal is an analog signal, and wherein the state is determined by comparing the analog signal to a threshold voltage.

4. The method of claim 1 wherein at least the first periodic signal is an analog signal, and wherein the state is determined by comparing the analog signal to a selected one of a plurality of threshold voltages.

5. The method of claim 1 wherein at least the first and the second periodic signals are analog signals, wherein the states of the first and the second periodic signals are determined by comparing the first and the second periodic signals to a threshold voltage, and wherein delays introduced by the comparing and the capturing associated with the first periodic signal is substantially the same as delays introduced by the comparing and the capturing associated with the second periodic signal.

6. The method of claim 1 wherein the capturing comprises causing a flip flop to capture the state in response to the strobe signal.

7. The method of claim 1 further comprising determining a time when the output signal switches from one output level to another output level.

8. The method of claim 1 wherein the selection signal corresponds to a set of address signals.

9. A signal testing system comprising:
   a tester generating a clock signal and a strobe signal that can be time shifted relative to the clock signal;
   an integrated circuit operating under the clock signal and generating at least a first and a second periodic signals, comprising:
       a plurality of pads including a first pad for accepting the clock signal, a second pad for accepting the strobe signals, and a third pad for delivering an output signal;
       a first and a second circuit for generating a first and a second state from the first and the second periodic signals, respectively; the first and the second circuits having substantially similar delays;
       a first and a second capturing device to capture the first and the second states, respectively, in response to the strobe signal; and
       an output device for providing to the third pad the output signal associated with one of the two captured states.

10. The system of claim 9 wherein the first and the second circuits each comprises a buffer having a predetermined threshold voltage.

11. The system of claim 9 wherein the first and the second capturing devices each comprises a flip flop.

12. The system of claim 9 wherein the output device comprises a multiplexer.

13. The system of claim 12 wherein the plurality of pads comprise at least one pad for accepting a selection signal for controlling the multiplexer.

* * * * *